(12) United States Patent
Lin et al.

(10) Patent No.: US 10,964,916 B2
(45) Date of Patent: Mar. 30, 2021

(54) FABRICATION OF MULTI-LEVEL GRADED PHOTONIC SUPER-CRYSTALS

(71) Applicant: University of North Texas, Denton, TX (US)

(72) Inventors: Yuankun Lin, Lantana, TX (US); David Lowell, Denton, TX (US); Safaa Hassan, Denton, TX (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 0 days.

(21) Appl. No.: 16/508,377

(22) Filed: Jul. 11, 2019

(65) Prior Publication Data

US 2020/0028119 A1    Jan. 23, 2020

Related U.S. Application Data

(60) Provisional application No. 62/699,858, filed on Jul. 18, 2018.

(51) Int. Cl.

| | |
|---|---|
| *H01L 51/52* | (2006.01) |
| *G02B 1/00* | (2006.01) |
| *H01L 51/56* | (2006.01) |
| *H01L 51/00* | (2006.01) |
| *G03F 7/20* | (2006.01) |

(52) U.S. Cl.
CPC .......... *H01L 51/5275* (2013.01); *G02B 1/005* (2013.01); *G03F 7/70408* (2013.01); *H01L 51/0021* (2013.01); *H01L 51/5221* (2013.01); *H01L 51/56* (2013.01); *H01L 2251/5346* (2013.01)

(58) Field of Classification Search
CPC ................. H01L 51/5275; H01L 51/56; H01L 2251/5346; H01L 51/5221; H01L 51/0021; G02B 1/005
See application file for complete search history.

(56) References Cited

U.S. PATENT DOCUMENTS

| | | | | |
|---|---|---|---|---|
| 2006/0119913 | A1* | 6/2006 | Moon ................ | G06K 7/10821 359/2 |
| 2007/0066871 | A1* | 3/2007 | Yang ................... | A61B 5/0062 600/173 |
| 2016/0238755 | A1* | 8/2016 | Jaiswal ............... | G02B 5/0891 |
| 2017/0363931 | A1* | 12/2017 | Rumpf .................... | G02F 1/293 |
| 2019/0198576 | A1* | 6/2019 | Schubert ............. | G02B 26/004 |

OTHER PUBLICATIONS

Lowell et al., ("Lowell") "Holographic fabrication of graded photonic super-crystals using an integrated spatial light modulator and reflective optical element laser projection system" Applied Optics, vol. 56, No. 36 (Year: 2017).*
"Partially-disordered photonic-crystal thin films for enhanced and robust photovoltaics" Physics.optics (Year: 2012).*

* cited by examiner

*Primary Examiner* — Ahmed N Sefer
(74) *Attorney, Agent, or Firm* — Jackson Walker LLP

(57) ABSTRACT

Direct pixel-by-pixel phase engineering in a SLM is an effective method for the holographic fabrication of graded photonic super-quasi-crystals with desired disorder and graded photonic super-crystals with rectangular unit-cells. Multiple levels of filling fractions of dielectric in the crystal have been created in the graded regions. Fabrication of these graded photonic super-crystals and super-quasi-crystals with small feature size is possible, using a laser projection system consisting of integrated spatial light modulator and reflective optical element.

8 Claims, 7 Drawing Sheets

FABRICATION OF MULTI-LEVEL GRADED PHOTONIC SUPER-CRYSTALS

This application claims priority to U.S. Provisional Patent App. No. 62/699,858, entitled "Fabrication of Multi-Level Graded Photonic Super-Crystals," filed Jul. 18, 2018, the entire contents of which are hereby incorporated by reference.

This invention was made with government support under Grant Nos. CMMI-1266251, CMMI-1661842 and ECCS-1407443 Awarded by the U.S. National Science Foundation. The Government has certain rights in the invention.

BACKGROUND

This disclosure pertains to fabrication of multi-level graded photonic super-crystals and applications in organic light emitting diodes.

Traditional periodic photonic crystals (PhCs) with a single basis have been intensively studied during the last decades in fundamental (such as photonic band gap) and applied research with applications in photonic crystal lasers. Second generation periodic PhCs have superlattices (dual basis) and have greatly enhanced broadband light absorption when the second generation PhCs were integrated with light absorptive or plasmonic materials. Future-generation PhCs, (here called graded photonic super-crystals (GPSCs) have superlattices and a graded filling fraction of dielectric material. It is called GPSC due to a large unit super-cell in the PhC and gradient basis in the unit super-cell. The graded filling fraction in GPSCs results in a wide distribution of refractive indices to meet the momentum conservation condition for light-coupling in a wide light wavelength range. Very recently, a group has fabricated GPSCs with dual symmetry, dual period, and dual basis. Due to the superlattice and graded refractive index in GPSCs, the light extraction efficiency in organic light emitting diodes (OLED) has reached 70% and light absorption has been enhanced in broad wavelengths in solar cells patterned with GPSCs. In general, combined changes in photonic crystal unit cell orientation, spacing and filling fraction lead toward desired optical functions.

On the other hand, photonic quasi-crystals are an attractive alternative to periodic PhCs. They do not have translational symmetry, but rotational symmetry, resulting in a rich Fourier spectrum for light confinement and manipulation. Broadband light control has been achieved when optical or plasmonic devices are patterned with photonic quasi-crystals. Photonic quasi-crystals offer intrinsically localized optical modes for laser applications. The introduction of disorder into periodic PhCs and photonic quasi-crystals has resulted in favorable broadband photon control.

Laser interference lithography has been used for the holographic fabrication of periodic PhCs and photonic quasi-crystals. Liquid crystal-based spatial light modulators (SLMs) have been used to encode the phase of the incident laser beam for use in laser interference lithography. Graded periodic PhCs have been fabricated using SLMs. When using an SLM for interference lithography, methods are based on computer generated holograms and pixel-by-pixel phase engineering. One advantage of using pixel-by-pixel phase engineering is that the same laser projection system can be used.

SUMMARY

The present disclosure relates generally to fabrication of multi-level graded photonic super-crystals.

In particular, the present disclosure relates to fabrication of multi-level graded photonic super-crystals with aperiodic structures and desired disorders. The present disclosure also relates to fabrication of multi-level periodic graded photonic super-crystals with a square or rectangular unit super-cell. High light extraction efficiency is predicted from organic light emitting diodes if their cathodes are patterned as the described photonic crystals. A laser projection system can be used for the fabrication of graded photonic super-crystals with various symmetries and features.

U.S. Pat. No. 9,523,925, incorporated herein by reference, describes a small device called a single reflective optical element (ROE) whose function is to produce photonic crystals or photonic crystal templates from a laser input. When the laser enters the ROE, portions of it reflect off reflective strips, causing the light to form an interference pattern. The interference pattern then creates a photonic crystal or photonic crystal template on the photosensitive material that is placed at the point where the light exits the device. FIG. 1 shows a possible design for a single reflective optical element. Four polished reflective strips 20 are arranged within a pre-arranged support 30. The support 30 is made up of a top piece 32, a bottom piece 34, and four solid support separators 36. The four solid support separators 36, which may be pillar shaped, separate the top piece 32 and the bottom piece 34. Within the top piece 32 of single reflective optical element 10 is a top cut-out 40. Within the bottom piece 34 of single reflective optical element 10 is a bottom cut-out 42. The top cut-out 40 and bottom cut-out 42 are generally square shaped and are different sizes. They are cut into the top piece 32 and bottom piece 34, respectively. The support 30 is preferably arranged so that the planes of the top piece 32 and bottom piece 34 are parallel to each other and with concentric positioning for the top cut-out 40 and bottom cut-out 42. The sides of the top cut-out 40 and bottom cut-out 42 may have rotational symmetry along an axis that is perpendicular to the parallel planes of the top piece 32 and bottom piece 34 and that passes through the centers of the top cut-out 40 and bottom cut-out 42. During operation, a laser beam is directed through top cut-out 40. In preferred embodiments the size of the top cut-out 40 is less than the size of the laser beam. Typical laser beams are about 2 cm in diameter. The size of bottom cut-out 42 is designed in such a way that the unreflected laser beam passing through the bottom cut-out 42 overlaps with the beams reflected by the polished reflective strips 20 that are supported by the top piece 32 and bottom piece 34. The unreflected laser beam and reflected beams can then be directed onto a photosensitive material and a substrate.

FIG. 2 shows the path of various portions of the laser as it travels through the single reflective optical element. U.S. Pat. No. 9,523,925 also describes a method of using the ROE to create photonic crystals or photonic crystal templates. In order to use the reflective optical element (ROE), it is placed in the path of an expanded and collimated laser beam. Quarter-wave plates can be used to change the polarization of the oncoming beam to circular polarization prior to incidence on the ROE. The ROE is oriented such that the top and bottom pieces are perpendicular to the incident laser beam. The mask on top of the ROE blocks all incoming laser light, except the areas immediately over the reflective strips (and possibly the center, depending on whether the central beam is desired), which generates n or n+1 number of beams based on the n number of strips. Also, given an incident beam's polarization, only a certain amount of p- or s-polarization will be reflected from the strips. The beams generated from the strips are directed to a space behind (below)

the ROE, where they form an interference region. It is in this interference region that a photosensitive material can be placed to create photonic crystals or photonic crystal templates using the ROE. The selection of the tilt angle of reflective surfaces in ROE can lead toward a desired period in photonic crystal.

High light extraction efficiency in organic LED involves patterning a cathode in graded photonic super-crystal. This relates to a method of patterning a cathode of an organic light-emitting diode (OLED) with a graded photonic super-crystal (a photonic crystal with superimposed lattice patterns and a gradient layout). The graded photonic super-crystal is formed with a total of eight interfering beams (four with a lower intensity, and four with a higher intensity). A software simulation shows that this method could yield a light extraction efficiency of up to 73.1% for OLEDs in visible when a certain period and pattern depth were chosen, which is above the U.S. Department of Energy's 2020 target of 70%.

Photonic quasi-crystals and photonic crystals with certain degrees of disorder can have a broad-band light-matter interaction. This disclosure relates to the holographic fabrication of graded photonic super-quasi-crystals through pixel-by-pixel phase pattern engineering using a spatial light modulator. Using the same phase pattern arranged in a decagon, we have fabricated graded photonic super-quasi-crystals with five-fold symmetry and multiple levels of gradients, and graded photonic super-crystals with rectangular unit super-cells, depending on the Fourier filter. Although a certain degree of disorder was incorporated in the quasi-crystals, we still observed the golden ratio in the diameters of the diffraction rings of the fabricated quasi-crystals, indicating five-fold symmetry. Using direct pixel-by-pixel phase engineering, the same laser projection system consisting of an integrated spatial light modulator and reflective optical element can be used for the fabrication of graded photonic super-crystals with various symmetries. The multi-level gradient effects on the optical properties of an organic light-emitting diode were simulated. When the cathode of an organic light emitting device is patterned in the graded photonic super-crystals, a light extraction efficiency up to 76% in the visible range can be achieved.

The present disclosure describes a method for fabricating multi-level graded photonic super-crystals with either a rectangular unit super-cell or aperiodic structures and desired disorders. The method can utilize the same laser projection system that is described above and shown in FIG. 3, with the interference of a total of nine beams from the input of a single laser. The method and system offer additional applications of the ROE described above, such as OLEDs and solar cells. Furthermore, it is predicted based on a software simulation that if an OLED cathode is patterned with the photonic super-crystals produced by this method, the resulting light extraction efficiency could be up to 76%.

DETAILED DESCRIPTION OF PREFERRED EMBODIMENTS

The present disclosure relates to fabrication of multi-level graded photonic super-crystals.

The present disclosure describes pixel-by-pixel phase engineering using a spatial light modulator (SLM) for the generation of graded photonic super-quasi-crystals with a certain degree of desired disorder and multiple levels of filling fractions of dielectric material in photonic crystals. In contrast to the photonic quasi-crystal, the reported graded photonic super-quasi-crystal has a graded filling fraction in square lattices and the graded lattices forms clusters in five-fold symmetry. Using the phase pattern but a different Fourier filter, graded photonic super-crystals with rectangular unit-cells have been fabricated.

Preferred embodiments relate to a method for fabricating multi-level graded photonic super-crystals using a laser projection system comprising an integrated spatial light modulator (SLM) for pixel-by-pixel phase engineering of beams and a reflective optical element (ROE) for beam overlapping to fabricate multi-level graded photonic super-crystals.

Figure 1:
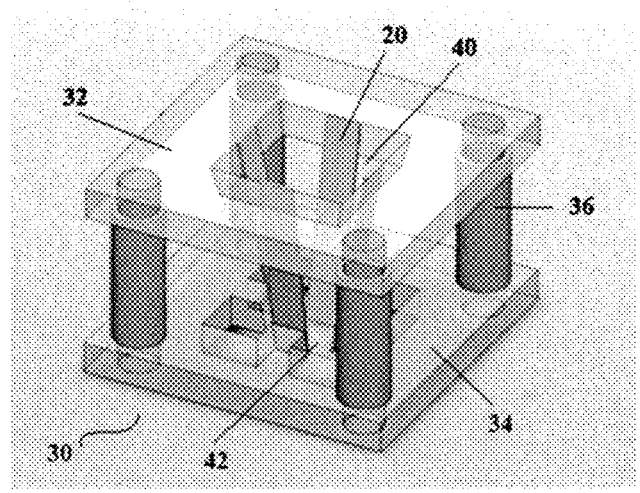
FIG. 1 shows a design for an exemplary single reflective optical element (ROE) in accordance with preferred embodiments described herein.
Figure 2:
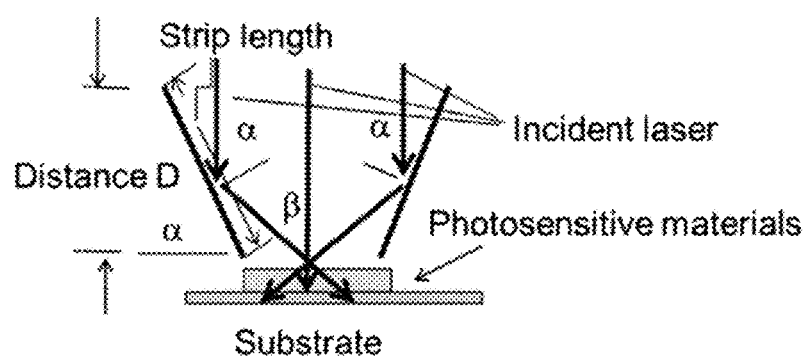
FIG. 2 shows the path of various portions of a laser as it travels through a single reflective optical element (ROE) in accordance with preferred embodiments described herein.
Figure 3:
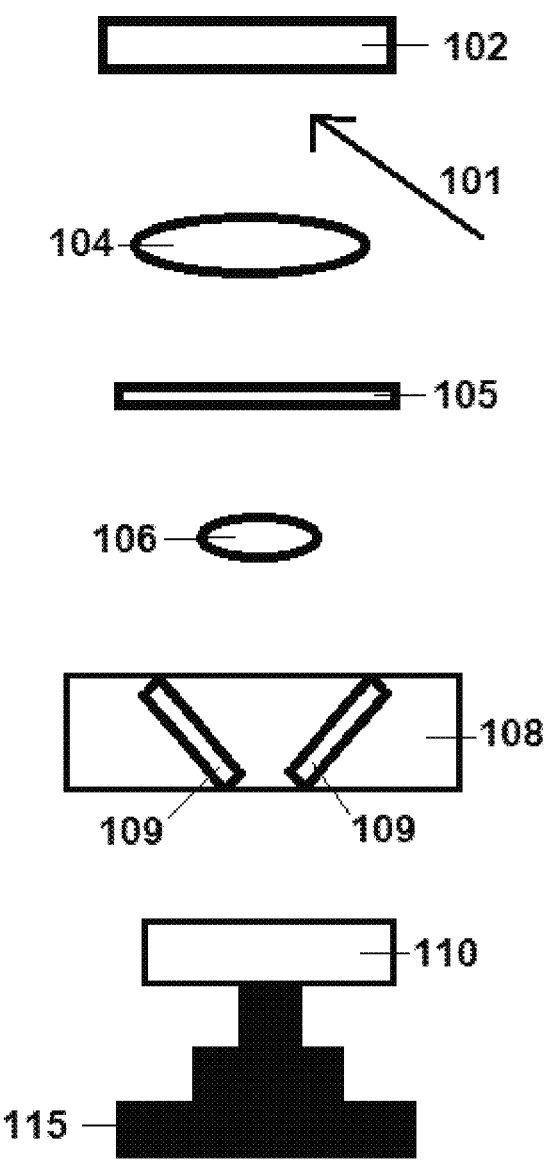
FIG. 3 shows a diagram of a system for creating graded photonic super-crystals that uses both a ROE and a spatial light modulator (SLM) in accordance with preferred embodiments described herein.

A system for creating graded photonic super-crystals that uses both the ROE described in U.S. Pat. No. 9,523,925 and a spatial light modulator (SLM) can be used to produce an eight-beam interference pattern from the input of a single laser. A schematic of preferred embodiments of the system including a ROE and SLM for creating graded photonic super-crystals is shown in FIG. 3. In preferred embodiments, the system includes a SLM 102 having a phase pattern for diffraction of an incoming laser beam 101, a first lens 104 having a first focal length, a second lens 106 having a second focal length, a Fourier filter 105, a ROE 108 having reflective surfaces 109 positioned at a tilt angle to promote beam overlapping, and a sample 110 that may optionally be placed on a motion stage 115. In operation, incoming laser beam 101 is incident upon SLM 102 and is diffracted into a series of diffracted laser beams which, in whole or in part, pass through first lens 104, Fourier filter 105, and second lens 106 and reflect, in whole or in part, off of reflective surfaces 109 in ROE 108 to ultimately produce an interference laser pattern that contacts sample 110 and creates a graded photonic super-crystal.

Figure 4:
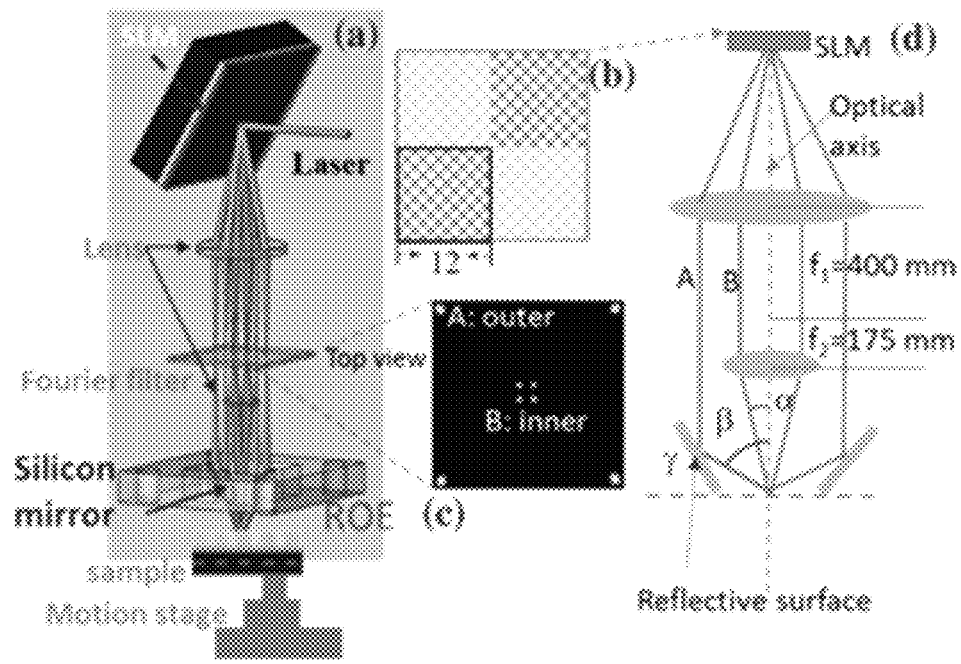
FIG. 4 shows (a) a schematic diagram of an experimental setup where an ROE is integrated with an SLM-based laser projection system, (b) a phase pattern with a super-unit of 24×24 pixels in SLM, (c) a top view of the diffraction pattern taken below the Fourier filter, and (d) an enlarged view of the optical setup showing the interference angles of the two diffraction beams A and B.

FIG. 4 shows (a) a schematic diagram of the experimental setup where an ROE is integrated with an SLM-based laser projection system. The laser beam is diffracted by a phase pattern with a super-unit of 24×24 pixels (b) in SLM and is filtered by a Fourier filter. FIG. 4(c) shows a top view of the diffraction pattern taken below the Fourier filter in FIG. 4(a). FIG. 4(d) shows an enlarged view of the optical setup showing the interference angles of the two diffraction beams A and B, as shown in FIG. 4(c). The inner diffraction spots in FIG. 4(c) are imaged through a second lens while an ROE interferes the outer diffraction spots. The size of ROE, the location of reflective surfaces, and the tilt angle of reflective surfaces can be adjusted in order to integrate the ROE with the SLM. The selection of the tilt angle of reflective surfaces in ROE can lead toward a desired period in graded photonic super-crystal. The resulting graded photonic super-crystal can also be used to increase the light trapping efficiency of solar cells.

Figure 5:
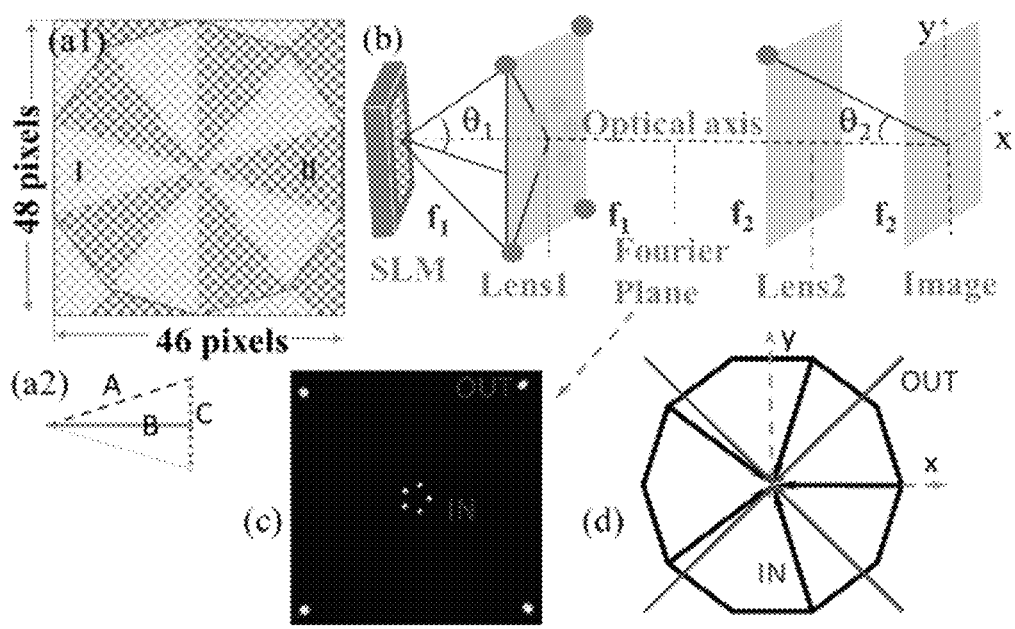
FIG. 5 shows (a1) a designed phase pattern where the checkerboard of gray levels (192, 254) and (158, 254) occupy alternating triangles inside the decagon, (a2) a schematic of one of the triangles of the decagon, (b) a schematic diagram of an experimental setup, integrating the SLM with a 4f imaging system, (c) an optical image of the diffraction pattern taken after the Fourier filter, and (d) a configuration of 4+5 interference with 4 "OUT" beams (purple) and 5 "IN" beams (black).

FIG. 5(a1) shows the design of the pixel-by-pixel phase pattern. In FIG. 5(a1), a decagon was created inside a rectangle. The decagon has ten identical triangles which were rotated to form the pattern with 10-fold symmetry. FIG. 5(a1) shows designed phase pattern where the checkerboard of gray levels (192, 254) and (158, 254) occupy alternating triangles inside the decagon. 46×48 pixel rectangles were used as a repeating unit to cover the whole SLM. FIG. 5(a2) shows a schematic of one of the triangles of the decagon. The lengths of A, B, and C were designed following Eq. (1) and (2). In order to form the triangle, the lengths of A (dashed red line), B (solid green line), and C (dotted blue line) need to meet the equations as follow:

$$A = B/\cos(18°) \quad (1)$$

$$C = 2B \tan(18°) \quad (2)$$

A, B and, C are in units of the side length of an SLM square pixel, which is 8×8 $\mu m^2$. The rectangle (46×48 pixels) in FIG. 5(a1) has a side length of 2A and a width of 2B. A, B, and C should be integer numbers. Two sets of small numbers, (21.03, 20, 13.00) and (24.18, 23, 14.95), for (A, B, C) respectively, meet Equations (1) and (2). The set of numbers, (21.03, 20, 13), is closer to integers. In order to integrate some degree of desired disorder in the fabricated 5-fold grade photonic super-quasi-crystals, we choose (24.18, 23, 14.95) and set the lengths of (A, B, C) to (24, 23, 15) for the triangle in FIG. 5(a2). The rectangle in FIG. 5(a1) has a length of 48 pixels and a width of 46 pixels.

Once the lengths of the rectangular and decagonal sides were calculated, pixels were assigned gray levels to create the triangular subunits of the decagon. A gray level of 192 was combined with 254 in a checkerboard fashion to fill region I in FIG. 5(a1) while a gray level of 158 was combined with 254 in a checkerboard fashion to fill region II. The selection of gray levels was based on a careful analysis of diffraction efficiency of the laser from the SLM and simulations of interference patterns as described later. The checkerboards of (192, 254) and (158, 254) were used to fill alternating triangles inside the decagon. Outside the decagonal area (in the radial direction), a checkerboard of gray level of (192,254) was used if the inside triangle was filled with (158,254) and vice versa. For pixels on the boundary of region I and region II, gray levels of (192,254) were used if more than 50% of pixel area was inside the triangle of region I. Otherwise (158,254) was used. The nature of this assignment would lead to some disorders however the formed small-period lattices are always in square symmetry. The number of (192,254) and (158,254) pixels was considered to control the phase of the "IN" beams however no conclusion has been drawn yet. FIG. 5(a1) was then used as a unit cell to fill the 1920×1080 pixels in SLM. Thus one gray level was assigned to each pixel in the SLM.

A certain degree of desired disorder was incorporated in the design. FIG. 5(b) shows a schematic diagram of the experimental optical setup, integrating the SLM with a 4f imaging system, with focal lengths $f_1$=400 mm for lens 1 and $f_2$=200 mm for lens 2, together with Fourier plane and image plane. A linearly polarized 532 nm laser (Cobolt Samba) with a total power of 50 mW was spatially filtered, expanded, and incident onto an SLM (Holoeye Pluto phase-only SLM). Ten (five pairs) first-order diffraction spots were observed due to the decagonal arrangement of the gray levels.

In order to test the diffraction condition for the decagon, whether it is B sin ($\alpha$)=$\lambda$ or 2B sin ($\alpha$)=$\lambda$ (where $\alpha$ is the first-order diffraction angle relative to the normal), the length B of the triangles in regions I and II in FIG. 5(a1) was modified. When the length B was changed, the width of the rectangle in FIG. 5(a1) was changed, the height was the same and the decagon was destroyed. The modified unit cell was used to fill the entire SLM. However, a pair of first-order diffraction spots in the horizontal direction still appeared for the measurement. The distance between the pairs of first-order diffraction spots was measured. For different B (row 2 in Table 1) used in each experiment, we calculated the distance between the first-order diffraction spots:

$$B \sin(\alpha) = \lambda \quad (3)$$

$$\text{Distance} = 2 \times \tan(\alpha) \times f_1 \quad (4)$$

The calculated distance is listed in row-3 of Table 1 along with the measured data in row-4. The agreement between calculated and measured data is very good, indicating that the diffraction condition was governed by Eq. (3).

TABLE 1

List of calculated and measured distance between diffraction spots

|  | exp-1 | exp-2 | exp-3 |
|---|---|---|---|
| B (in pixels) | 26 | 13 | 17 |
| Calculated distance (in mm) | 2.05 | 4.09 | 3.13 |
| Measured distance (in mm) | 2.07 | 4.06 | 3.16 |

The diffraction pattern from the SLM using FIG. 5(a1) as a unit cell was taken at the Fourier plane in FIG. 5(b). FIG. 5(c) shows an optical image of the diffraction pattern taken after the Fourier filter. A Fourier filter was used to allow the first-order diffraction (labelled as "OUT" in FIG. 5(c)) due to the periodic array of gray levels of (192, 254) and (158, 254) and five alternating diffraction spots (labelled as "IN" in FIG. 5(c)) out of the ten diffraction spots due to decagonal array of triangles in the SLM phase pattern. These nine beams overlap in an arrangement as shown in FIG. 5(d) and form an interference pattern after going through the second lens. FIG. 5(d) shows the configuration of 4+5 interference with 4 "OUT" beams (purple) and 5 "IN" beams (black).

Diffraction efficiency measurements of the laser beams from the phase pattern in the SLM have been performed for the selection of gray levels. Because of reflective SLM used in this study, no back-diffraction occurs. A Fourier filter was used to select a desired beam for the measurement of diffraction efficiency. The gray levels in the pixels of the SLM are translated into the phase of laser beam using the gamma curve of the SLM, where gray level of 255 corresponds to a phase of 2π and gray level of 0 corresponds to a phase of 0π.

The diffraction efficiency (ratio of laser intensity of one of the 1$^{st}$ order diffracted beam over the total intensity) of the gray level arrays in checkerboard fashion with a unit cell in inset of FIG. 6(a) has been measured as shown in FIG. 6(a) for various combinations of gray levels. FIG. 6(a) shows measured SLM first order diffraction efficiency as a function of gray level from the checkerboard phase pattern with unit cell in the inset. For example, for the red square curve with dashed line, one gray level was 128 and the other one was varied from 160 (=128+32 where x=32) to 200 (=128+72), and so on. The diffraction efficiency was measured and plotted as a function of the gray level difference. For the combinations of (255−x, 255) and (128, 128+x), the maximum diffraction efficiency occurs near x=127, corresponding to approximately a π phase difference. For the other combinations, (34, 34+x) and (66, 66+x), the maximum diffraction efficiency occurs near x=96. The maximums happen at different locations in FIG. 6(a) due to the gamma curve of the SLM, which is linear for small and large gray levels, but nonlinear over the whole range. Gray levels were selected for the checkerboard which fall in the linear range of the gamma curve.

Figure 6:
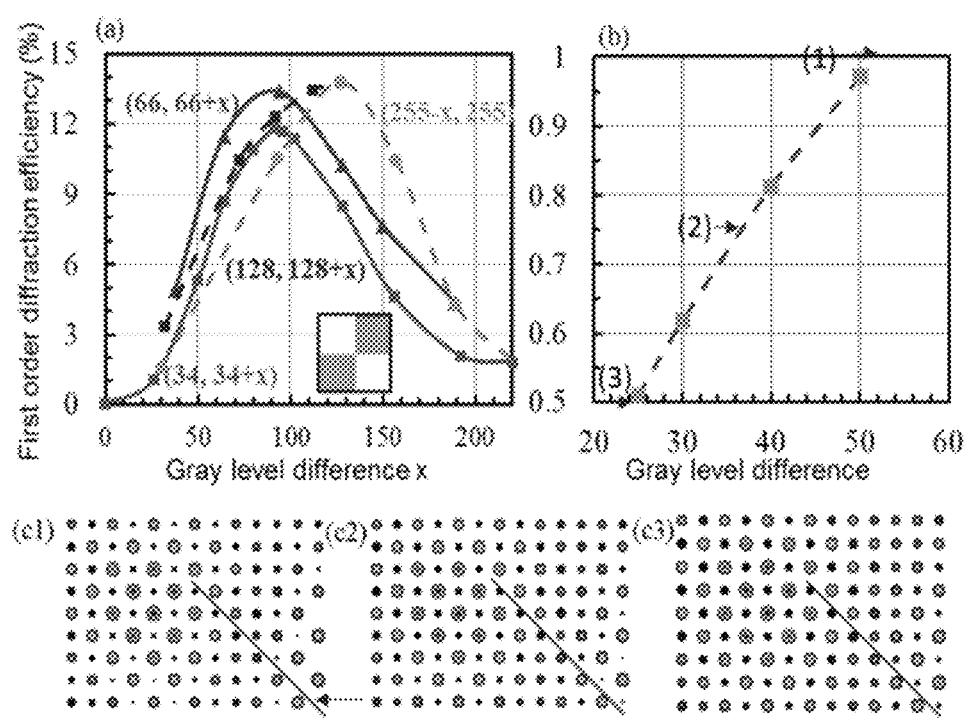
FIG. 6 shows (a) measured SLM first order diffraction efficiency as a function of gray level from the checkerboard phase pattern with unit cell in the inset, (b) measured diffraction efficiency of the "IN" beam as a function of gray level difference between region I and region II, and ($c1$-$c3$) simulated nine-beam interference pattern with the same intensity threshold for intensity ratios of "OUT" beam to "IN" beam of 9, 12, and 18, respectively.

The diffraction efficiency of "IN" beam in FIG. 5(c) as a function of gray level difference (x−y) has been measured using the phase pattern in FIG. 5(a). The results are shown in FIG. 6(b) for gray level (x, 254) for region I and gray level (y, 254) for region II in FIG. 5(a). FIG. 6(b) shows measured diffraction efficiency of the "IN" beam as a function of gray level difference between region I and region II in FIG. 5(a1). FIG. 6(c1-c3) shows simulated nine-beam interference pattern with the same intensity threshold for intensity ratios of "OUT" beam to "IN" beam of 9, 12, and 18, respectively. The red line indicates the lattice gradient direction and the red arrow indicates the location of missing lattice points. Assuming an average of 9% diffraction efficiency for the "OUT" beams and 1%, 0.75%, and 0.5% for the "IN" beams, the interference patterns of the nine beams (as described later in Eq. (5)) are shown in FIGS. 6(c1), 6(c2), and 6(c3), respectively. If the efficiency of the "IN" beams is high, the gradient of lattice along the line in FIG. 6(c) is also high but some lattices are missing at certain intensity thresholds, as indicated by the arrow in the figure. In order to have a relatively high gradient lattice that can also survive in holographic lithography, 0.75% efficiency for "IN" beams was used at the gray level difference of 34 in FIG. 6(b). Thus gray levels of (175+0.5×34, 254) and (175−0.5×34, 254) were used for region I and II, respectively. 254 instead of 255 was used because 255 might be explained as 0π instead of 2π in SLM.

The formed multiple-beam interference was recorded in a negative photoresist, modified dipentaerythritol hexa/pentaacrylate (DPHPA) monomer as described elsewhere. The DPHPA mixture photoresist was spin-coated on glass slides at 3200 RPM for 30 seconds. The samples were exposed to the multiple-beam interference for a typical exposure time of ~5 seconds. The exposed samples were immersed in propylene glycol monomethyl ether acetate for 5 minutes, rinsed with isopropyl alcohol, and dried in air.

The intensity, I(r), of the multiple-beam interference pattern is determined by Eq. (5):

$$I(r) = \left\langle \sum_{i=1}^{m} E_i^2(r,t) \right\rangle + \sum_{i<j}^{m} E_i E_j \hat{e}_i \cdot \hat{e}_j \cos\left[(k_j - k_i) \cdot r + (\delta_j - \delta_i)\right]. \tag{5}$$

where k, δ, E, e are the wave vector, the initial phase, the electric field amplitude, and the electric field polarization direction, respectively.

The "OUT" beams in FIG. 5(c,d) have a large interference angle with respect to the optic axis while the "IN" beams have a small interference angle. Due to the large difference between these two interference angles, the lattice constants in the interference pattern can be understood, approximately, by considering the interference of "OUT" beams and "IN" beams, separately.

The diffraction angle $\theta_1$ in FIG. 5(b) for "OUT" beams is determined by:

$$2 \times \text{pixel length} \times \sin(\theta_1) = \lambda \tag{6}$$

The interference angle $\theta_2$ is calculated by:

$$\tan\theta_2 = f_1 \tan\theta_1 \times \frac{\sqrt{2}}{f_2} \tag{7}$$

Figure 7:
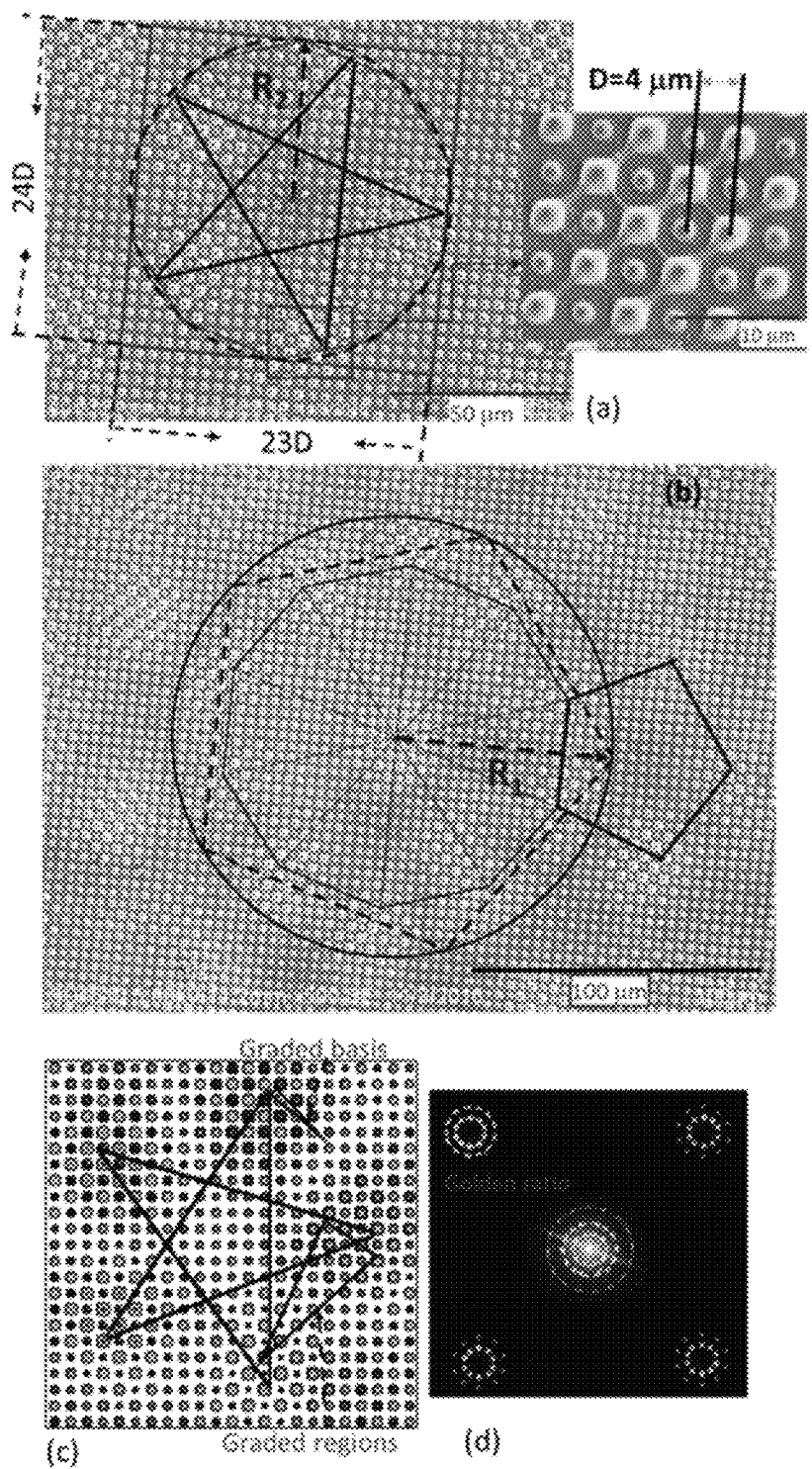
FIG. 7 shows (a) SEM image of a fabricated sample in one area where the graded regions have five-fold symmetry due to the interference of individual beams with their next-neighbor beams, (b) SEM image of a fabricated sample in another area where the graded regions are a result from the interference of individual beams with their neighboring beams, (c) simulated five-beam interference pattern corresponding to the five-fold graded region, and (d) diffraction pattern of 532 nm laser from a fabricated sample.

FIG. 7(a) shows a scanning electronic beam (SEM) image of a region in the fabricated sample using the phase pattern in FIG. 5(a), particularly in one area where the graded regions have five-fold symmetry due to the interference of individual beams with their next-neighbor beams as indicated by the solid lines (where five of them form a star shape). Inset is an enlarged SEM view of the graded region in a rectangle with a lattice spacing parameter D=4 μm. Approximately, the square lattice formed by the "OUT" beams is modulated by the 5-fold symmetric graded superlattice related to the 5 "IN" beams. An enlarged view of graded super-lattice is shown in the inset of FIG. 7(a). The lattice parameter, D, in FIG. 7(a) in the x or y-direction of the formed lattice is calculated by Eq. (8) by considering $\tan(\theta) \cong \sin(\theta)$ for small angle:

$$D = \frac{2\pi}{\Delta k_x} = \frac{2\pi}{2k \sin\theta_2 \cos(45)} = \frac{1 \text{ pixel length}}{2} \quad (8)$$

The pixel side length=8 μm, so D=4 μm as confirmed by the SEM measurement in FIG. 7(a).

Approximately, the 5-fold rotationally symmetric pattern can be understood by the interference pattern due to the "IN" beams in FIG. 5(d) with an interference angle $\alpha_2$ relative to the optical axis. The angle $\alpha_2$ is related to diffraction angle $\alpha$ by $\tan(\alpha) \times f_1 = \tan(\alpha_2) \times f_2$. The wavevectors of the five "IN" beams can be described by:

$$k_q = k\left(\sin\alpha_2 \cos\frac{2(q-1)\pi}{5}, \sin\alpha_2 \sin\frac{2(q-1)\pi}{5}, \cos\alpha_2\right), \quad (9)$$

$$q = 1, 2, \ldots, 5$$

The interference between one beam and next neighboring beam as shown in FIG. 7(a) by the solid line can be described by $k_q - k_{q-2}$:

$$k_q - k_{q-2} = 2k \sin\alpha_2 \cos\left(\frac{\pi}{10}\right)\left(\cos\left(\frac{2q}{5} - \frac{3}{10}\right)\pi, \sin\left(\frac{2q}{5} - \frac{3}{10}\right)\pi, 0\right) \quad (10)$$

The set of $k_q - k_{q-2}$ forms a circle and the generated holographic structure forms a circle as indicated by a dashed line in FIG. 7(a) with a radius $R_2$:

$$R_2 = 2\pi/((k_q - k_{q-2}) \text{radius}) = \lambda/(2 \sin(\alpha_2)\cos(\pi/10)) = \quad (11)$$

$$B/(4\cos(\pi/10)) = 6.05 \times (SLM \text{ pixel length}) = 12.1 \, D$$

where D=4 μm and the same D value is used in equation and text afterward. Inside the dashed circle in FIG. 7(a), the graded pattern has five-fold symmetry as indicated by the solid decagon: the holograhic graded-super-lattice appears alternating in the decagon.

Due to the lack of translational symmetry in the graded photonic super-quasi-crystal, an SEM in another region of the sample could be different. One example is shown in FIG. 7(b). FIG. 7(b) shows SEM image of a fabricated sample in another area where the graded regions are a result from the interference of individual beams with their neighboring beams as indicated by the dashed lines. SEM image in this region can be approximately explained by the interference of neighboring "IN" beams, indicated by the dashed lines in FIG. 7(b), with the following $k_q - k_{q-1}$:

$$k_q - k_{q-1} = 2k \sin\alpha_2 \cos\left(\frac{3\pi}{10}\right)\left(\cos\left(\frac{2q}{5} - \frac{1}{10}\right)\pi, \sin\left(\frac{2q}{5} - \frac{1}{10}\right)\pi, 0\right) \quad (12)$$

The holographic structures due to $k_q - k_{q-1}$ also form a circle, as indicated by the circle in FIG. 7(b), with a radius $R_1$:

$$R_1 = 2\pi/((k_q - k_{q-1}) \text{radius}) = \lambda/(2 \sin(\alpha_2)\cos(3\pi/10)) = \quad (13)$$

$$B/(4\cos(3\pi/10)) = 9.78 \, SLM \text{ pixel length} = 19.6 \, D$$

The circle is centered on a graded lattice. Inside the circle, ten graded regions are indicated by the vertices of the decagon as shown in FIG. 7(b). The decagon structure has also been observed in conventional photonic quasi-crystals. Pre-designed disorder is visible in the FIG. 7(b) as two graded regions are overlapped in the left side of the decagon.

FIG. 7(c) shows simulated five-beam interference pattern corresponding to the five-fold graded region of the graded photonic super-quasi-crystal in FIG. 7(a). Lines (five them forming a star shape) indicate the interference between a beam and its next neighbors. The graded basis and graded regions are highlighted. The star-like simulated pattern is in clear agreement with the SEM image in FIG. 7(a). There are two types of gradients in the simulation: one is the graded basis as indicated by a smaller triangle in the figure and the other is the graded region. As indicated by the other larger triangle in the figure, the region at the base of the triangle has less white (empty) space than the one at the tip of the triangle. In the SEM in FIG. 7(a), the top and right graded regions have a higher filling fraction of dielectric than those at the left and at the bottom, in agreement with the simulation.

FIG. 7(d) shows the diffraction pattern of a 532 nm laser from the fabricated sample of the graded photonic super-quasi-crystal. The first, second, and third-order diffraction rings are indicated by dashed white circles. The square symmetry from the small periodicity is indicated by the four patterns at the four corners in the FIG. 7(d). The quasi-crystal generates ten-fold symmetric diffraction spots. In the figure, the ten-fold spots form the first-order (the strongest), the second-order, and the third-order (the weakest) ring structures. The ratios of the second-order ring diameter to that of the first-order ring and the third-order ring diameter to that of the second-order ring were measured to be 1.609 and 1.610, respectively, close to theoretical value of 1.618 (golden ratio), further confirming the five-fold symmetry in the fabricated sample.

The same phase pattern in FIG. 5(a1) was used with gray levels of (192, 254) for region I and (158, 254) for region II.

Although interference lithography of 4+5 beams in FIG. 5(c,d) has generated graded photonic super-crystal with small periodicity in a square lattice and five-fold rotational symmetry in its large features, its optical properties have not been simulated.

Figure 8:
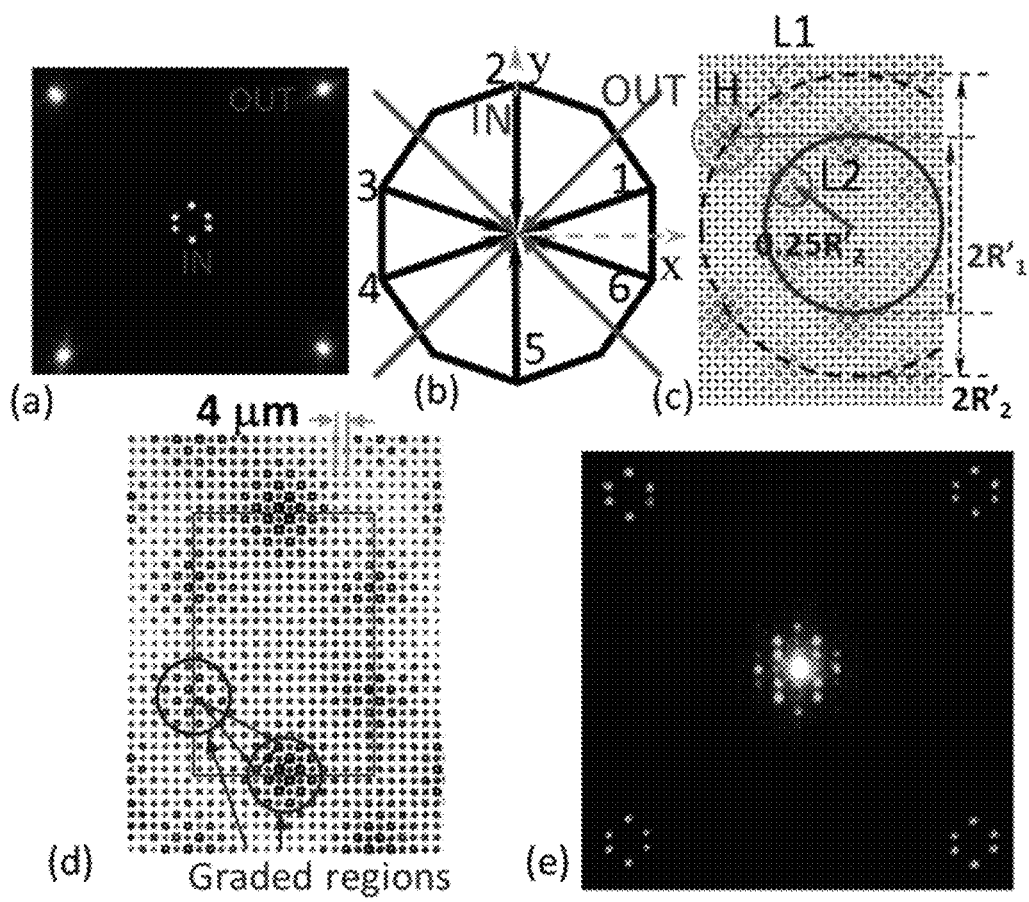
FIG. 8 shows (a) optical image of the diffraction pattern from the SLM taken after the Fourier filter, (b) a schematic of the 4+6 interference geometry, (c) shows a simulated interference pattern, (d) optical microscope image of a fabricated sample in DPHPA, and (e) diffraction pattern from a fabricated sample.

FIG. 8(a) shows optical image of the diffraction pattern from the SLM taken after the Fourier filter. FIG. 8(b) shows a schematic of the 4+6 interference geometry. FIG. 8(c) shows a simulated interference pattern. One circle with a radius of $R'_1$ characterizes the interference between pairs of beams (1,4), (2,5) and (3,6) and another circle with a radius of $R'_2$ for the interference between pairs of beams (1,2), (2,3), (4,5), and (5,6) in FIG. 8(b). Circles labelled with H and L highlight the high-intensity and low-intensity graded regions, respectively.

If six of the "IN" beams are picked up as shown in FIG. 8(a) and interfered with four of the "OUT" beams as arranged in FIG. 8(b), a graded photonic super-crystal structure can be generated as simulated in FIG. 8(c), also with two levels of graded regions. The graded lattice region inside one circle labelled with H has a higher interference intensity than the graded region inside the other circles labelled with L1 and L2 in FIG. 8(c). The graded regions form a pattern with rotational symmetry as the interfering "OUT" beams (1, 2, . . . , 6) in FIG. 8(b) were selected from the beams with ten-fold symmetry. Approximately, the interference between pairs of beams (1,4), (2,5) and (3,6) form a pattern characterized by a red circle with a radius of R'$_1$, which can calculated by:

$$R'_1 = 2\pi/((k_1 - k_4) \text{radius}) = \qquad (14)$$
$$2\pi/((k_2 - k_5) \text{radius}) = 2\pi/((k_3 - k_6) \text{radius}) = 11.50 \, D$$

The circle labelled with R'$_1$ in FIG. 8(c) has a radius of 11.5 D. The graded high intensity regions are located at the top and bottom of the circle in FIG. 8(c). Approximately, the interference between pairs of beams (1,2), (2,3), (4,5) and (5,6) forms a pattern characterized by a dashed circle with a radius of R'$_2$=19.56D, which can calculated by:

$$R'_2 = 2\pi/((k_1 - k_2) \text{radius}) = 2\pi/((k_2 - k_3) \text{radius}) = \qquad (15)$$
$$2\pi/((k_4 - k_5) \text{radius}) = 2\pi/((k_5 - k_6) \text{radius}) = 19.56 \, D$$

Both high-intensity and low-intensity graded regions are indicated by circles labelled with H, L1, and L2. One low-intensity graded region circled by the circle L2 in FIG. 8(c) is located 0.25R'$_2$ from the center. Its location can be understood as a mirror image of the low-intensity graded region circled by circle L1 near the top of the figure, mirrored through the solid line crossing through the circle H in FIG. 8(c). Because the "OUT" beam configuration in FIG. 7(b) also has two-fold symmetry and mirror symmetry, the formed interference pattern has translational symmetry. Their periodicities in the x and y-directions and the unit cell are shown in the fabricated sample in FIG. 8(d) by the solid rectangle. FIG. 8(d) shows an optical microscope image of a fabricated sample in DPHPA. The periodicity in y-direction equals 2R'$_1$ and the periodicity in x-direction can be calculated by R'$_1$ and R'$_2$ following their relation in FIG. 8(c):

$$x - \text{periodicity} = \sqrt{R'^2_2 - R'^2_1} = D\sqrt{19.56^2 - 11.50^2} = 15.83D \qquad (16)$$

The diffraction pattern of the 532 nm laser from the fabricated sample is shown in FIG. 8(e). The rectangle indicates a unit cell. Four clusters of diffraction spots at the four corners of the square are due to the square lattice with a period of D. In each cluster, the six-spots are due to the graded regions with x-periodicity of 15.83D and y-periodicity of 23.00D. The arrangement of six spots is due to the configuration of six graded regions in the unit cell in FIG. 8(d). The top and bottom diffraction spots in each cluster are due to the high-intensity graded regions at the top and bottom of the unit cell, and other spots are due to the low-intensity graded regions.

Using computer generated holograms, in general, any desired structure can be designed and fabricated. The pixel-by-pixel phase method might be limited to certain structures, however, high resolution structures can be fabricated.

Using direct pixel-by-pixel phase engineering with the SLM, the "OUT" beams will always have the same diffraction angle, thus the same positions in the Fourier plane, but the "IN" beams can have five-fold symmetry as in this paper, square symmetry, or hexagonal symmetry. The same reflective optical element (ROE) can be used when a laser projection system is used to fabricate these crystals with small and desired feature sizes. The feature size of these crystals will be determined by the angle of the reflective surface in the ROE. If the parameter D is reduced to one micron, the cathode of organic light emitting devices (OLED) can be patterned in these crystals for the improvement of light extraction efficiency. However, the GPSC occurs in a narrow range in z-direction. A high-resolution motion stage is needed in order to fabricate GPSCs with sub-micron period.

Figure 9:
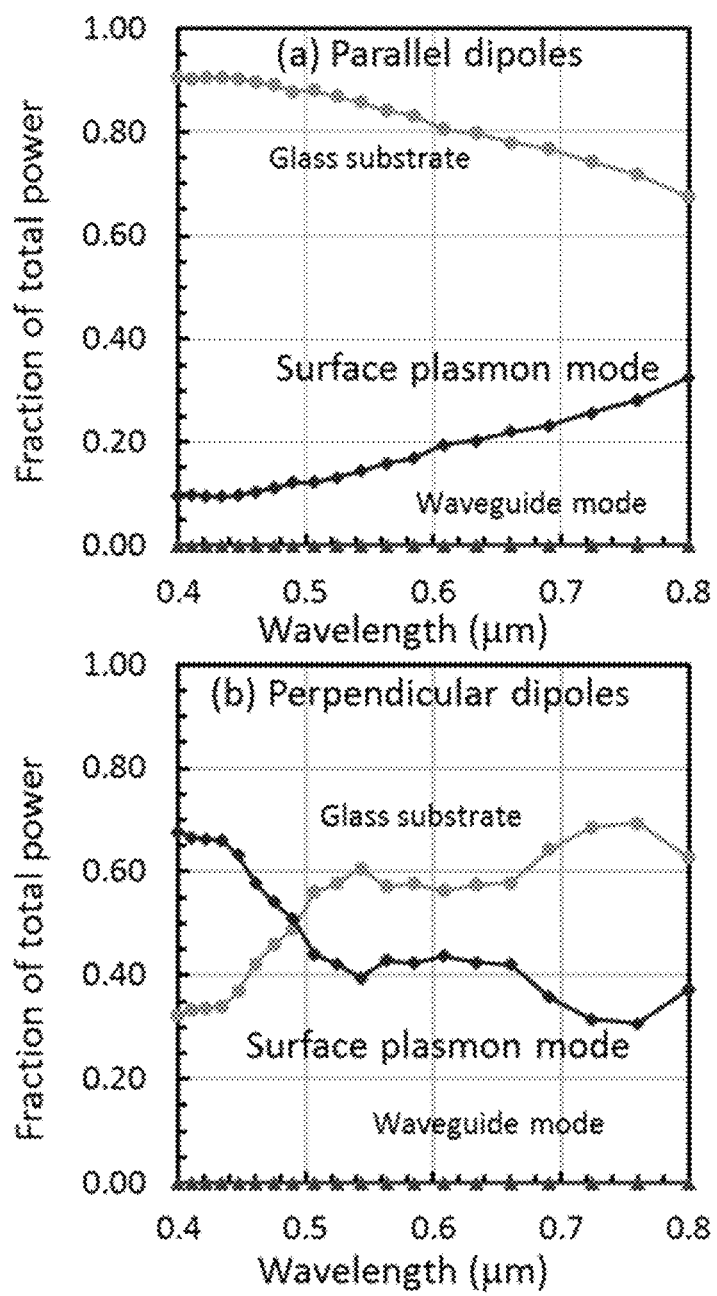
FIG. 9 shows simulated fractions of total power from an organic light emitting diode (OLED) in the glass substrate, surface plasmon mode, and waveguide mode for dipole orientations in parallel to (a) and perpendicular to (b) the layers of the organic layer, when the cathode of the OLED is patterned with the graded photonic super-crystals with a rectangular unit super-cell.

Because the GPSCs in FIG. 8(d) are a periodic crystal, the multiple grade level effect on the optical property of light extraction efficiency can be simulated when the cathode of the OLED is patterned with the crystal. During the simulation, the following OLED structural parameters are used: 100 nm thickness of Al cathode, 100 nm thickness of an organic layer where binary Al/organic patterns occur in 40 nm, and 100 nm thickness of ITO on top of 1000 nm thickness of glass substrate. The following optical parameters are used: the refractive indices for the glass (1.45), organic (1.8), and ITO (1.8) layers are used and the ten different incoherent electric point-dipole sources are placed in the middle of OLED. The absorption of light was neglected. FIG. 9 shows simulated fractions of total power from an organic light emitting diode (OLED) in the glass substrate, surface plasmon mode, and waveguide mode for dipole orientations in parallel to (a) and perpendicular to (b) the layers of the organic layer, when the cathode of the OLED is patterned with the graded photonic super-crystals with a rectangular unit super-cell. FIG. 9(b) shows a stair-like light extraction efficiency into the glass substrate, which may be due to the two grade regions in the unit super-cell in FIG. 8(d). The light extraction efficiencies into the glass substrate are calculated to be 72.7%, 76.7%, 72.1% and 69.7% for wavelength ranges of 400-500, 500-600, 600-700 and 700-800 nm, respectively. OLEDs usually have a narrow emission wavelength. The graded photonic super-crystals or super-quasi-crystals with multiple graded regions in the unit super-cell provide a freedom to optimize the light extraction efficiency of the OLED to a certain narrow wavelength. A simulated E-field intensity at a wavelength of 480 nm shows that the color covers a large view angle. However, the spatial intensity distribution is not as uniform as the one in GPSC in a square symmetry.

The light extraction efficiency into the air was simulated. It was not easy to simulate a device with a glass substrate thickness in micron range. Thus we assumed 200 nm thickness for the glass substrate in the simulation. Overall the extraction efficiency into the air had 6.6% less than the above efficiency into the glass substrate (for example, 72.7%-6.6%).

Direct pixel-by-pixel phase engineering in a SLM is an effective method for the holographic fabrication of graded photonic super-quasi-crystals with desired disorder and graded photonic super-crystals with rectangular unit-cells. Multiple levels of filling fractions of dielectric in the crystal have been created in the graded regions. Fabrication of these graded photonic super-crystals and super-quasi-crystals with small feature size is possible, using a laser projection system consisting of integrated spatial light modulator and reflective optical element.

REFERENCES

The following documents and publications are hereby incorporated by reference.

A. Tandaechanurat, S. Ishida, D. Guimard, M. Nomura, S. Iwamoto, and Y. Arakawa, "Lasing oscillation in a three-dimensional photonic crystal nanocavity with a complete bandgap," Nat. Photonics 5, 91-94 (2011).

Y. Chassagneux, R. Colombelli, W. Maineult, S. Barbieri, H. E. Beere, D. A. Ritchie, S. P. Khanna, E. H. Linfield, and A. G. Davies, "Electrically pumped photonic-crystal terahertz lasers controlled by boundary conditions," Nature 457, 174-178 (2009).

V. Rinnerbauer, Y. Shen, J. D. Joannopoulos, M. Soljačić, F. Schäffler, and I. Celanovic, "Superlattice photonic crystal as broadband solar absorber for high temperature operation," Opt. Express 22, A1895 (2014).

V. Rinnerbauer, E. Lausecker, F. Schäffler, P. Reininger, G. Strasser, R. D. Geil, J. D. Joannopoulos, M. Soljačić, and I. Celanovic, "Nanoimprinted superlattice metallic photonic crystal as ultraselective solar absorber," Optica 2, 743 (2015).

J. Hendrickson, J. B. Guo, W. B. Zhang, and R. Soref, "Wideband perfect light absorber at midwave infrared using multiplexed metal structures," Opt. Lett. 37, 371-373 (2012).

D. Lowell, J. Lutkenhaus, D. George, U. Philipose, B. Chen, and Y. Lin, "Simultaneous direct holographic fabrication of photonic cavity and graded photonic lattice with dual periodicity, dual basis, and dual symmetry," Opt. Express 25, 14444-14452 (2017).

D. Lowell, S. Hassan, M. Adewole, U. Philipose, B. Chen, and Y. Lin, "Holographic fabrication of graded photonic super-crystals using an integrated spatial light modulator and reflective optical element laser projection system," Appl. Opt. 56, 9888 (2017)

S. Hassan, D. Lowell, and Y. Lin, "High light extraction efficiency in organic light-emitting diodes by patterning the cathode in graded superlattice with dual periodicity and dual basis," J. Appl. Phys. 121, 233104 (2017).

S. Hassan, D. Lowell, M. Adewole, D. George, H. Zhang, and Y. Lin, "Extraordinary light trapping enhancement in silicon solar cell patterned with graded photonic super-crystals," Photonics 4, 50 (2017).

Raymond C. Rumpf and Javier Pazos, "Synthesis of spatially variant lattices," Opt. Express 20, 15263-15274 (2012).

A. Harb, F. Torres, K. Ohlinger, Y. Lin, K. Lozano, Di Xu, and K. P. Chen, "Holographically formed three-dimensional Penrose-type photonic quasicrystal through a lab-made single diffractive optical element," Optics Express 18, 20512-20517 (2010).

S. P. Gorkhali, J. Qi, and G. P. Grawford, "Electrically switchable mesoscale Penrose quasicrystal structure," Appl. Phys. Lett. 86, 011110 (2005).

X. Wang, C. Y. Ng, W. Y. Tam, C. T. Chan, and P. Sheng, "Large-area two-dimensional mesoscale quasi-crystals," Adv. Mater. 15, 1526-1528 (2003).

J. Xu, R. Ma, X. Wang, and W. Y. Tam, "Icosahedral quasicrystals for visible wavelengths by optical interference holography," Opt. Express 15, 4287-4295 (2007).

G. Zito, B. Piccirillo, E. Santamato, A. Marino, V. Tkachenko, and G. Abbate, "Two-dimensional photonic quasicrystals by single beam computer-generated holography," Opt. Express 16, 5164-5170 (2008).

J. Xavier, M. Boguslawski, P. Rose, J. Joseph, and C. Denz, "Reconfigurable Optically Induced Quasicrystallographic Three-Dimensional Complex Nonlinear Photonic Lattice Structures," Adv. Mat. 22, 356-360 (2010).

V. Arrizón, D. Sánchez de-la-Llave, G. Méndez, and Ulises Ruiz, "Efficient generation of periodic and quasi-periodic non-diffractive optical fields with phase holograms," Opt. Express 19, 10553-10562 (2011).

E. Martins, J. Li, Y. Liu, V. Depauw, Z. Chen, J. Zhou, and T. Krauss, "Deterministic quasi-random nanostructures for photon control," Nat. Commun. 4, 2665 (2013).

J. Xavier, J. Probst, and C. Becker, "Deterministic composite nanophotonic lattices in large area for broadband applications," Sci. Rep. 6,38744 (2016).

S. Kasture, A. P. Ravishankar, V. J. Yallapragada, R. Patil, N. V. Valappil, G. Mulay, and V. G. Achanta, "Plasmonic quasicrystals with broadband transmission enhancement," Scientific Reports 4, 5257 (2014).

M. S. Vitiello, M. Nobile, A. Ronzani. A. Tredicucci, F. Castellano, V. Talora, L. Li, E. H. Linfield, and A. G. Davies, "Photonic quasi-crystal terahertz lasers," Nat. Commun. 5, 5884 (2014).

K. Vynck, M. Burresi, F. Riboli, and D. S. Wiersma, "Photon management in two-dimensional disordered media," Nat. Mater. 11, 1017 (2012).

A. Oskooi, P. Favuzzi, Y. Tanaka, H. Shigeta, Y. Kawakami, and S. Noda, "Partially-disordered photonic-crystal thin films for enhanced and robust photovoltaics," Appl. Phys. Lett. 100, 181110 (2012).

A. Oskooi, M. De Zoysa, K. Ishizaki, S. Noda, "Experimental Demonstration of Quasi-resonant Absorption in Silicon Thin Films for Enhanced Solar Light Trapping," ACS Photonics 1, 304-309 (2014).

Y. Hu, Z. Wang, Z. Weng, M. Yu, and D. Wang, "Bio-inspired hierarchical patterning of silicon by laser interference lithography," Applied Optics 55, 1 (2016).

J. Lutkenhaus, D. George, M. Moazzezi, U. Philipose, and Y. Lin, "Digitally tunable holographic lithography using a spatial light modulator as a programmable phase mask," Opt. Express 21, 26227-26235 (2013).

K. Ohlinger, J. Lutkenhaus, B. Arigong, H. Zhang, and Y. Lin, "Spatially addressable design of gradient index structures through spatial light modulator based holographic lithography," J. Appl. Phys. 114, 213102 (2013).

J. Lutkenhaus, D. George, B. Arigong, H. Zhang, U. Philipose, and Y. Lin, "Holographic fabrication of functionally graded photonic lattices through spatially specified phase patterns," Appl. Opt. 53, 2548-2555 (2014).

S. Behera, and J. Joseph, "Single-step optical realization of bio-inspired dual-periodic motheye and gradient-index-array photonic structures," Opt. Lett. 41, 3579 (2016).

D. Lowell, D. George, J. Lutkenhaus, C. Tian, M. Adewole, U. Philipose, H. Zhang, Y. Lin, "Flexible Holographic Fabrication of 3D Photonic Crystal Templates with Polarization Control through a 3D Printed Reflective Optical Element," Micromachines 7, 128 (2016).

D. Shechtman, I. Blech, D. Gratias, and J. W. Cahn, "Metallic phase with long-range orientational order and no translational symmetry," Phys. Rev. Lett. 53, 1951-1953 (1984).

D. Levine and P. J. Steinhardt, "Quasicrystals. I. Definition and structure," Phys. Rev. B 34, 596 (1986).

What is claimed is:

1. A system for fabricating multi-level graded photonic super-crystals, comprising:
   a laser for generation of an incoming laser beam;
   a spatial light modulator (SLM) comprising a phase pattern for diffraction of the incoming laser beam along an optical axis;

a first lens having a first focal length located adjacent to the spatial light modulator (SLM);
a second lens having a second focal length;
a Fourier filter located between the first lens and the second lens, wherein the first lens, the second lens, and the Fourier filter are each positioned substantially parallel to each other, and wherein the first lens, the second lens, and the Fourier filter are each perpendicular to and centered around the optical axis;
a reflective optical element (ROE) located adjacent to the second lens, wherein the reflective optical element (ROE) comprises reflective surfaces positioned at a tilt angle relative to the optical axis; and
a sample located adjacent to the reflective optical element (ROE), wherein the incoming laser beam is diffracted by the spatial light modulator (SLM) into a series of diffracted laser beams, wherein all or a portion of the diffracted laser beams pass through the first lens, the second lens and the Fourier filter along the optical axis, wherein all or a portion of the diffracted laser beams reflect off of the reflective surfaces of the reflective optical element (ROE) to produce beam overlapping, and wherein the spatial light modulator (SLM), the first lens, the second lens, the Fourier filter, and the reflective surfaces of the reflective optical element (ROE) generate an interference laser pattern out of the incoming laser beam that contacts the sample and creates a multi-level graded photonic super-crystal.

2. The system of claim 1, further comprising a motion stage for holding and moving the sample.

3. The system of claim 1, wherein the multi-level graded photonic super-crystal comprises periodic structures.

4. The system of claim 1, wherein the multi-level graded photonic super-crystal comprises a rectangular unit supercell.

5. A method for fabricating multi-level graded photonic super-crystals, comprising:
directing an incoming laser beam at a spatial light modulator (SLM) to produce diffracted laser beams, wherein the diffracted laser beams are centered around an optical axis;
generating an interference laser pattern by passing all or a portion of the diffracted laser beams through a combination of:
a first lens having a first focal length,
a Fourier filter,
a second lens having a second focal length, wherein the first lens, the Fourier filter, and the second lens are each positioned substantially parallel to each other, and wherein the first lens, the Fourier filter, and the second lens are each perpendicular to and centered around the optical axis, and
a reflective optical element (ROE), wherein the reflective optical element (ROE) comprises reflective surfaces positioned at a tilt angle relative to the optical axis, and wherein the reflective surfaces reflect the diffracted laser beams; and
contacting a sample with the interference laser pattern to create a multi-level graded photonic super-crystal.

6. The method of claim 5, wherein the multi-level graded photonic super-crystal comprises periodic structures.

7. The method of claim 5, wherein the multi-level graded photonic super-crystal comprises a rectangular unit supercell.

8. The multi-level graded photonic super-crystal fabricated by the method of claim 1.

* * * * *